United States Patent
Waters et al.

(10) Patent No.: US 10,856,434 B2
(45) Date of Patent: Dec. 1, 2020

(54) REDUCING AEROACOUSTICS CAUSED BY COOLING AIR FLOW WITH SEGMENTED FOAM BAFFLES IN AN INFORMATION HANDLING SYSTEM

(71) Applicant: DELL PRODUCTS, L.P., Round Rock, TX (US)

(72) Inventors: Paul A. Waters, Austin, TX (US); Chris E. Peterson, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 201 days.

(21) Appl. No.: 16/110,479

(22) Filed: Aug. 23, 2018

(65) Prior Publication Data
US 2020/0068741 A1 Feb. 27, 2020

(51) Int. Cl.
H05K 7/20 (2006.01)
G06F 1/20 (2006.01)
G06F 1/18 (2006.01)

(52) U.S. Cl.
CPC ........... *H05K 7/20145* (2013.01); *G06F 1/20* (2013.01); *H05K 7/20172* (2013.01); *G06F 1/187* (2013.01)

(58) Field of Classification Search
CPC ............ H05K 7/20145; H05K 7/20172; G06F 1/187; G06F 1/20
USPC .......... 454/184, 262, 906; 181/212, 219, 222
See application file for complete search history.

(56) References Cited

U.S. PATENT DOCUMENTS

| 4,860,163 A * | 8/1989 | Sarath | H05K 7/20563 361/695 |
| 5,526,228 A | 6/1996 | Dickson et al. | |
| 6,646,876 B2 | 11/2003 | Carr et al. | |
| 7,033,137 B2 | 4/2006 | Shufeldt | |
| 7,610,993 B2 * | 11/2009 | Sullivan | F01N 1/02 181/212 |
| 7,986,526 B1 | 7/2011 | Howard et al. | |
| 8,155,332 B2 | 4/2012 | Gross et al. | |
| 9,875,773 B1 | 1/2018 | Waters et al. | |
| 2008/0186668 A1 | 8/2008 | Naufel et al. | |
| 2017/0219153 A1 * | 8/2017 | Hill | F02M 35/12 |
| 2018/0090181 A1 | 3/2018 | Paterra et al. | |
| 2018/0102124 A1 | 4/2018 | Huo et al. | |

\* cited by examiner

*Primary Examiner* — Vivek K Shirsat
(74) *Attorney, Agent, or Firm* — Isidore PLLC

(57) ABSTRACT

An air-cooled enclosure of an information handling system includes a chassis that receives at least one heat-generating functional component. One or more air movers are positioned within the chassis to move cooling air through the chassis. An air duct is provided within the chassis and is positioned to direct the cooling air between the one or more air movers and the at least one heat-generating functional component. The air duct has a transverse space across the air duct sized for one or more acoustic standing waves to resonate between lateral walls of the air duct as modes of a resonant wavelength. One or more vertical blocks of an acoustic absorbing material are attached inside the air duct at respective transverse positions of one or more pressure or velocity antinodes of a selected one or more modes of the resonant wavelength.

17 Claims, 10 Drawing Sheets

REDUCING AEROACOUSTICS CAUSED BY COOLING AIR FLOW WITH SEGMENTED FOAM BAFFLES IN AN INFORMATION HANDLING SYSTEM

BACKGROUND

1. Technical Field

The present disclosure relates in general to air cooling in an information handling system (IHS), and more particularly to internally suppressing noise in an IHS due to air cooling.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

New generations of enterprise IHSs have higher computing density and thus have a corresponding increase in cooling requirements. To meet the higher cooling requirements, to cool heat-generating functional components, such as central processing units (CPUs), Peripheral Component Interconnect (PCI) cards, etc., higher airflow is needed, and thus air movers at much higher speeds than for conventional cooling. Current server fan technology has reached such extreme fan speeds as to induce HDD throughput failure from acoustics and vibration transmitted to the HDDs, which is generally referred to as aeroacoustics. Aeroacoustics is a branch of acoustics that studies noise generation via either turbulent fluid motion or aerodynamic forces interacting with surfaces. In some conventional applications, sufficient mitigation of aeroacoustic disturbance to throughput by the HDDs has been provided by increasing the distance between fans and HDDs or adding acoustic foams. This solution is no longer effective in some instances for the high-frequency disturbances coming from today's high-performance fans. The amount of distance required for an affected HDD to be in the reverberant field and no longer in direct noise impact of the fans cannot be allocated within the chassis without substantially reducing room for functional components. In addition to the increases in vibration and acoustics predicted for future air movers, the problem is further exacerbated, as HDD sensitivity to vibration and acoustics is also projected to increase with storage capacity and transfer speeds.

BRIEF SUMMARY

In accordance with the teachings of the present disclosure, an air-cooled enclosure includes a chassis that receives at least one heat-generating functional component of an information handling system (IHS). One or more air movers are positioned within the chassis to move cooling air through the chassis. An air duct provided within the chassis is positioned to direct the cooling air between the one or more air movers and the at least one heat-generating functional component. The air duct has a transverse space across the air duct sized for one or more acoustic standing waves to resonate between lateral walls of the air duct as modes of a resonant wavelength. One or more vertical blocks of an acoustic absorbing material are attached inside the air duct at a respective transverse position of one or more pressure or velocity antinodes of a selected one or more modes of the resonant wavelength.

In accordance with the teachings of the present disclosure, an IHS includes at least one heat-generating functional component and an air-cooled enclosure. The air-cooled enclosure includes a chassis that receives the at least one heat-generating functional component. One or more air movers are positioned within the chassis to move cooling air through the chassis. An air duct provided within the chassis is positioned to direct the cooling air between the one or more air movers and the at least one heat-generating functional component. The air duct has a transverse space across the air duct sized for one or more acoustic standing waves to resonate between lateral walls of the air duct as modes of a resonant wavelength. One or more vertical blocks of an acoustic absorbing material are attached inside the air duct at a respective transverse position of one or more antinodes of a selected one or more modes of the resonant wavelength.

In accordance with the teachings of the present disclosure, a method includes receiving, by an automated manufacturing system, at least one heat-generating functional component in a chassis of an air-cooled enclosure of an IHS. The method includes positioning one or more air movers within the chassis to move cooling air through the chassis. The method includes positioning an air duct to direct the cooling air between the one or more air movers and the at least one heat-generating functional component. The air duct has a transverse space across the air duct sized for one or more acoustic standing waves to resonate between lateral walls of the air duct as modes of a resonant wavelength. The method includes attaching one or more vertical blocks of an acoustic absorbing material inside the air duct at a respective transverse position of one or more antinodes of a selected one or more modes of the resonant wavelength.

The above presents a general summary of several aspects of the disclosure to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
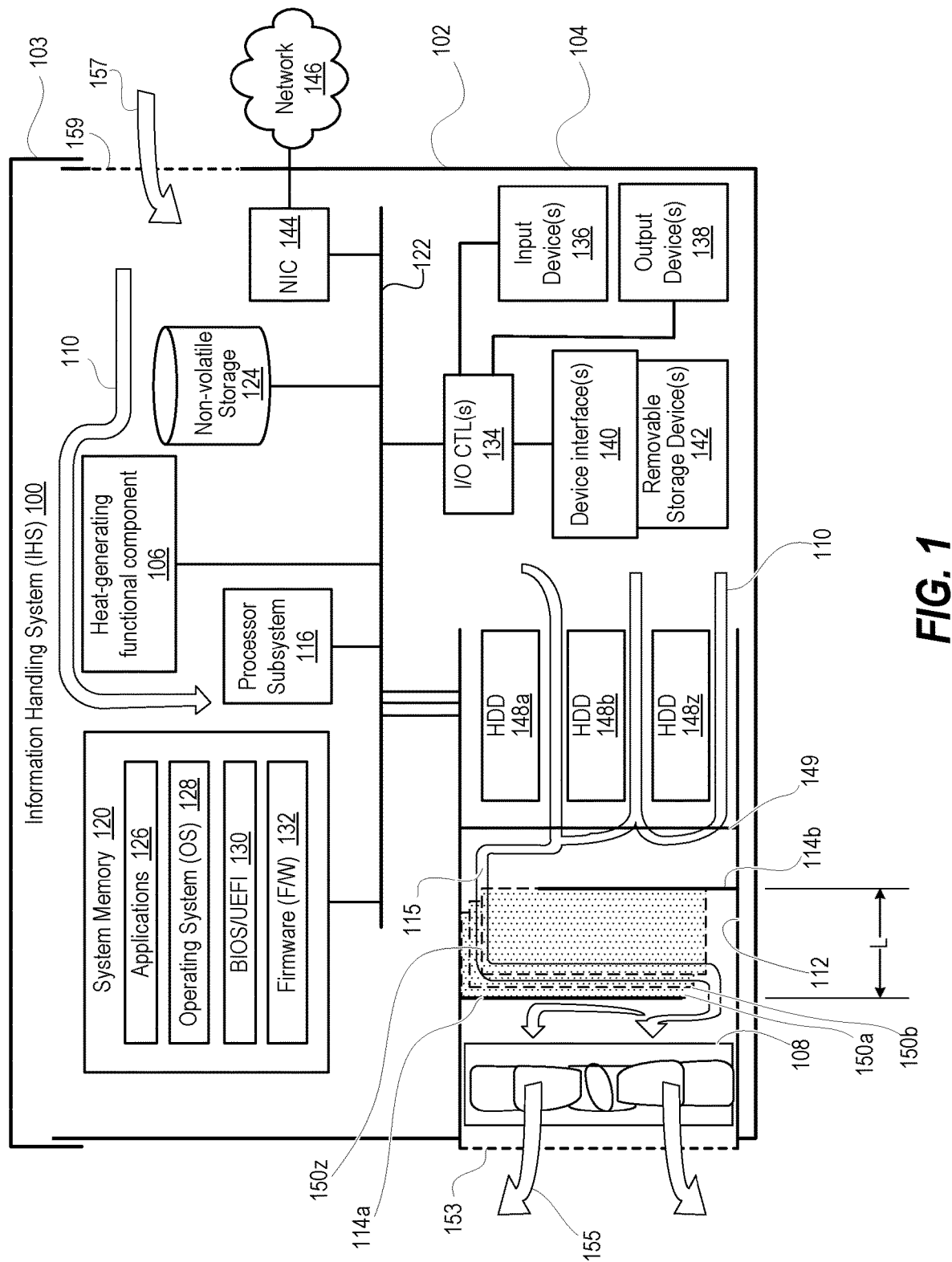
FIG. 1 is block diagram representation illustrating an example information handling system (IHS) having an air-cooled enclosure with internal acoustic attenuation, according to one or more embodiments.

According to aspects of the present innovation, a method, a memory subsystem, and an information handling system (IHS) each provide incorporating baffles within an air duct that create a vertically alternating air flow pattern, such as a triangular or square wave air flow pattern, to attenuate noise between air movers and functional components. In addition to providing baffles and absorbing foam strategically placed along the longitudinal path of the air duct, the present disclosure recognizes that a horizontal space between first and second baffles enable certain frequencies of aeroacoustic noise from the air movers to resonate within the air duct. The resonance in turn propagates to the functional components. The resonance of aeroacoustic noise disrupts performance of the functional components when the air movers are operating at an upper range of fan speed. For some sensitive hard drives and some high-performance fans, performance has been observed to degrade as low as 80% or more of full fan speed. For example, each HDD and fan combination have a fan speed past which HDD throughput degradation exceeds a company's goal, e.g., a recent test with 60 mm/25000-rpm fans resulted in HDDs performing at 20% of maximum throughput. Air movers of other types, operating speeds or dimensions, such as 40 mm fan modules, may have other frequencies of aeroacoustic disturbances. Alternatively, a frequency band that is not the most dominate aeroacoustic disturbance frequency for an air mover may resonate for the particular dimensions of an air duct, requiring mitigation. In addition to longitudinally positioned noise mitigation structures, the present innovation provides further attenuation of acoustic resonant frequencies across the air duct between pairs of baffles. In particular, segmented foam blocks that are entirely, or substantially free standing are positioned at antinode transverse points defined by one or more of the acoustic resonant frequencies.

In physics and engineering, for a dynamical system according to wave theory, a mode is a standing wave state of excitation, in which all the components of the system will be affected sinusoidally under a specified fixed frequency. A mode of vibration is characterized by a modal frequency and a mode shape. It is numbered according to the number of half waves in the vibration. For example, if a vibrating beam with both ends pinned displayed a mode shape of half of a sine wave (one peak on the vibrating beam) it would be vibrating in mode 1. If it had a full sine wave (one peak and one trough) it would be vibrating in mode 2.

An antinode position can correspond to one of a pressure antinode and a velocity antinode. Without having to block air flow substantially across the horizontal dimension of the air duct, the segmented foam blocks absorb acoustic energy at particularly active points in horizontally resonate noise from the air movers. Thus, the segmented foam blocks mitigate the effects of operating air movers at high speeds, which in turn mitigates reduction in reliability and performance of the air-cooled functional components. Specifically, being placed at the antinode position of the resonate frequencies increases the absorption. Although the segmented foam blocks divide the vertically alternating air flow into longitudinally parallel air flows, the segmented foam blocks do not significantly constrain the amount of cooling air passing through the air duct to the functional components.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates a block diagram representation of example information handling system (IHS) 100 having air-cooled enclosure 102, which includes cover 103 and chassis 104 that receives at least one heat-generating functional component 106. One or more air movers 108, such as blowers or fan modules, are positioned within chassis 104 to move cooling air flow 110 through chassis 104 to cool at least one heat-generating functional component 106. Air duct 112 is provided within chassis 104 and is positioned to direct cooling air flow 110 between one or more air movers 108 and at least one heat-generating functional component 106. First baffle 114a is attached within air duct 112 to transversely block longitudinal aeroacoustic energy and redirect a first portion of air flow 110 through air duct 112. Second baffle 114b is attached within the air duct 112, parallel to and spaced apart from first baffle 114a with a vertical offset, to transversely block longitudinal aeroacoustic energy and redirect a second portion of the air flow through air duct 112. First and second baffles 114a-b define a vertically alternating air flow path 115 through air duct 112 to attenuate longitudinally-directed acoustic vibrations. In particular, vertically alternating air flow path 115 similar to a square wave.

Within the general context of IHSs, IHS 100 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. The IHS may include random access memory (RAM), one or more processing resources such as a central processing unit (CPU) or hardware or software control logic, ROM, and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses operable to transmit communications between the various hardware components.

Referring again to FIG. 1, IHS 100 includes processor subsystem 116 coupled to system memory 120 and other heat-generating functional components 106 via system interconnect 122. System interconnect 122 can include active components such as PCI cards 123 that are heat-generating functional components 106. System interconnect 122 can be interchangeably referred to as a system bus, in one or more embodiments. Also coupled to system interconnect 122 is non-volatile storage, e.g., a non-volatile random access memory (NVRAM) storage 124, within which can be stored one or more software and/or firmware modules and one or more sets of data that can be utilized during operations of IHS 100. These one or more software and/or firmware modules can be loaded into system memory 120 during operation of IHS 100. Specifically, in one embodiment, system memory 120 can include therein a plurality of such modules, including one or more of applications 126, operating system (OS) 128, basic input/output system (BIOS) or Uniform Extensible Firmware Interface (UEFI) 130, and firmware (F/W) 132. These software and/or firmware modules have varying functionality when their corresponding program code is executed by processor subsystem 116 or secondary processing devices within IHS 100. For example, application(s) 126 may include a word processing application, a presentation application, and a management station application, among other applications.

IHS 100 further includes one or more input/output (I/O) controllers 134 which support connections by and processing of signals from one or more connected input device/s 136, such as a keyboard, mouse, touch screen, or microphone. I/O controllers 134 also support connection to and forwarding of output signals to one or more connected output devices 138, such as a monitor or display device or audio speaker(s). Additionally, in one or more embodiments, one or more device interfaces 140, such as an optical reader, a USB, a card reader, Personal Computer Memory Card International Association (PCMCIA) slot, and/or a high-definition multimedia interface (HDMI), can be associated with IHS 100. Device interface(s) 140 can be utilized to enable data to be read from or stored to corresponding removable storage device(s) 142, such as a compact disk (CD), digital video disk (DVD), flash drive, or flash memory card. In one or more embodiments, device interface(s) 140 can further include general purpose I/O interfaces such as inter-integrated circuit ($I^2C$), system management bus (SMB), and peripheral component interconnect (PCI) buses.

IHS 100 comprises a network interface controller (NIC) 144. NIC 144 enables IHS 100 and/or components within IHS 100 to communicate and/or interface with other devices, services, and components that are located external to IHS 100. These devices, services, and components can interface with IHS 100 via an external network, such as example network 146, using one or more communication protocols that can include transport control protocol/internet protocol (TCP/IP) and network block device (NBD) protocol. Network 146 can be a local area network, wide area network, personal area network, and the like, and the connection to and/or between network and IHS 100 can be wired, wireless, or a combination thereof. For purposes of discussion, network 146 is indicated as a single collective component for simplicity. However, it should be appreciated that network 146 can comprise one or more direct connections to other devices as well as a more complex set of interconnections as can exist within a wide area network, such as the Internet.

Within the illustrative embodiments, the at least one heat-generating functional component 106 can include CPUs 147 of the processor subsystem 116 and active components of system interconnect 122 such as PCI cards 123. In addition, heat-generating functional components 106 can include hard disk drives (HDD) 148a-z positioned at a backplane 149 within chassis 104 that are cooled by air movers 108. In one embodiment, HDDs 148a-z are susceptible to error or damage caused by acoustic vibrations from air movers 108 when operated past critical fan speed where company's goal for HDD throughput performance without aeroacoustic noise mitigation. A transverse space across air duct 112 (orthogonal to the side planar view of FIG. 1) between first and second baffles 114a-b is sized for one or more acoustic standing waves to resonate between lateral walls of the air duct 112 as modes of the resonant wavelength. One or more vertical blocks 150a-z of an acoustic absorbing material are positioned at strategically chosen positions across a transverse, horizontal space within air duct 112 as a function of the resonance wavelength. In particular, each one of the one or more vertical blocks 150a-z is attached to at least one of an interior wall of air duct 112 and one of first and second baffles 114a-b at a respective transverse position of one or more antinodes of a selected one or more modes of the resonant wavelength.

In one or more embodiments, air movers 108 pull exhaust cooling air 110 from an exhaust vent 153 into chassis 104 as exhaust air 155, causing intake air 157 to enter an air inlet 159. In other embodiments, the present disclosure provides aeroacoustic benefits for air movers that push cooling air through chassis 104 such as an air mover (not shown) at air inlet 159. In one or more embodiments, an air mover such as a blower can be positioned externally to a chassis with aeroacoustic disturbances entering into the chassis as part of the air flow. Aspects of the present disclosure can attenuate the aeroacoustic disturbances either outside or inside of the chassis.

Figure 2:
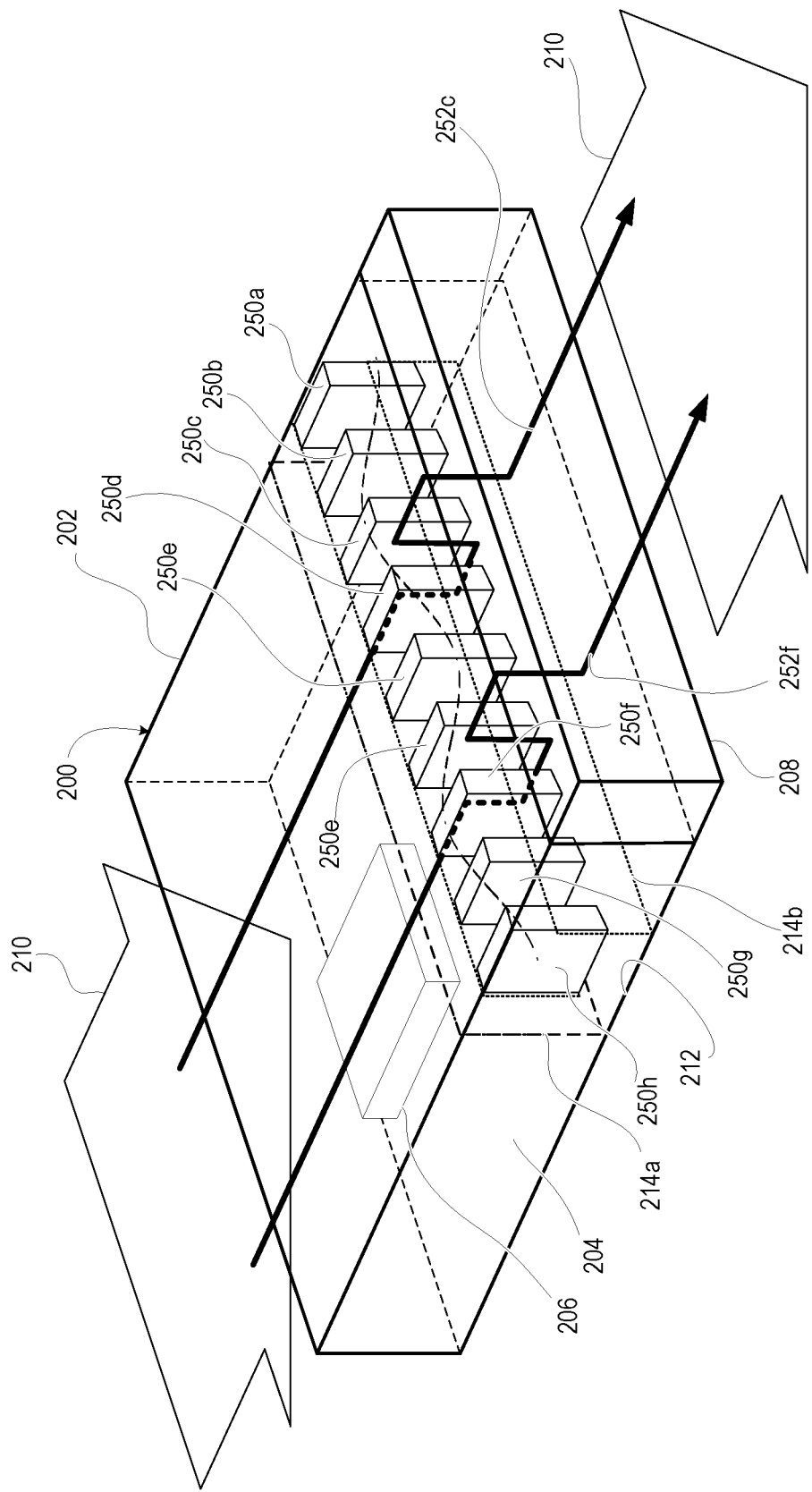
FIG. 2 is an isometric diagram of an example IHS having segmented foam blocks between air duct baffles for acoustic noise attenuation, according to one or more embodiments.

FIG. 2 is an isometric diagram illustrating example IHS 200 having segmented foam blocks between air duct baffles for acoustic noise attenuation. Segmented foam blocks prevent air cooling noise from damaging internal components. IHS 200 can be an implementation of IHS 100 (FIG. 1). Air-cooled enclosure 202 includes chassis 204 that houses at least one heat-generating functional component 206. One or more air movers 208, such as fan modules, are positioned in lateral alignment at a back side 207 of chassis 204 to exhaust cooling air flow 210 from chassis 204. One or more air movers 208 pull cooling air past at least one heat-generating functional component 206. Air duct 212 is provided within chassis 204 and is positioned to direct cooling air flow 210 from at least one heat-generating functional component 206 to one or more air movers 208. Air duct 212 is a rectangular space across chassis 204 and has a transverse dimension that corresponds to a resonant wavelength. First baffle 214a is attached within air duct 212 to transversely block a first upper portion of air flow 210 through air duct 212. Second baffle 214b is attached within air duct 212 parallel to first baffle 214a with a vertical offset to transversely block a second lower portion of air flow 210 through air duct 212. First and second baffles 214a-b define undulations in air flow path through air duct 212 to attenuate longitudinally-directed acoustic vibrations.

Figure 3:
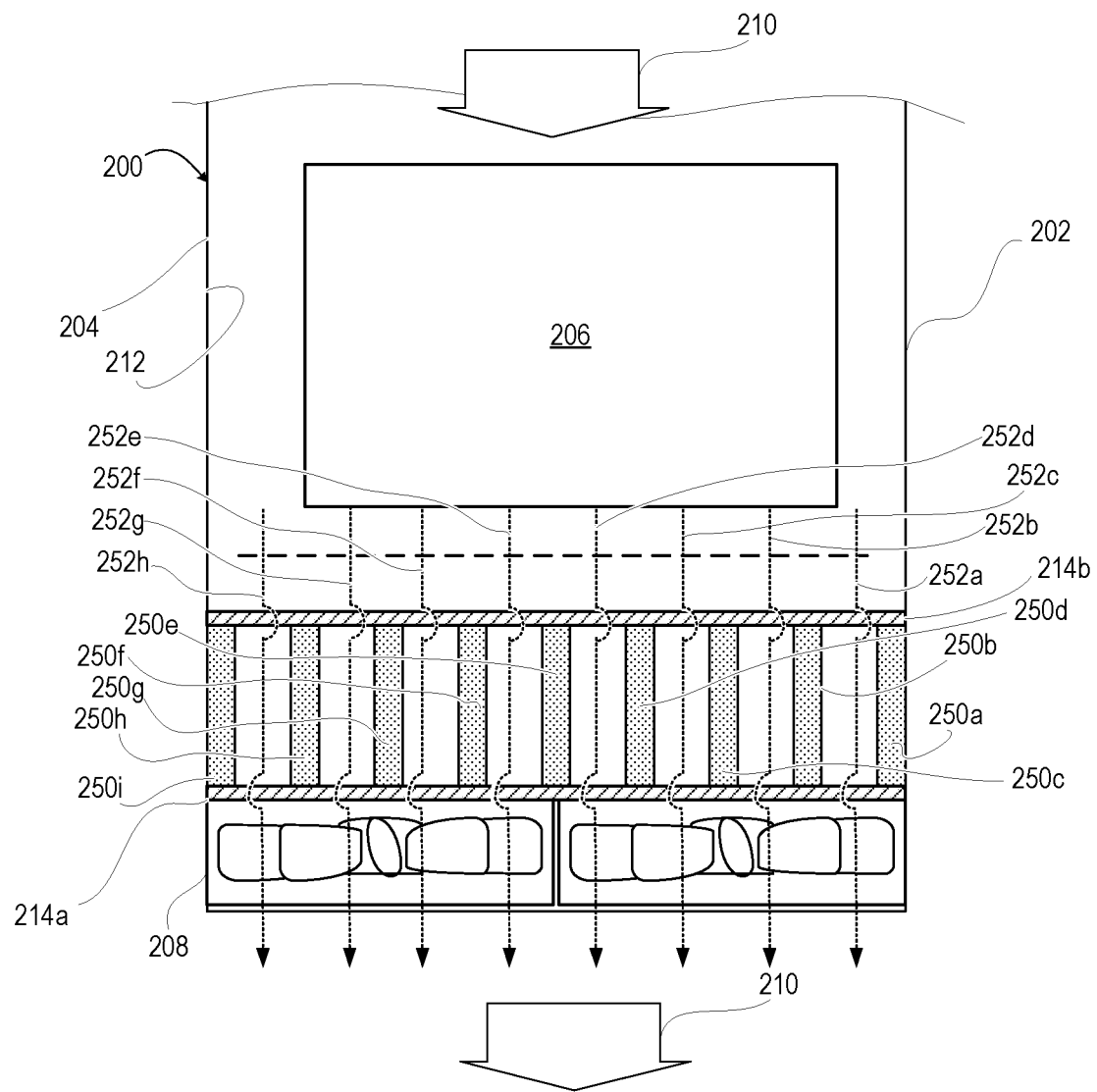
FIG. 3 is a top view of the example IHS of FIG. 2, according to one or more embodiments.
Figure 4:
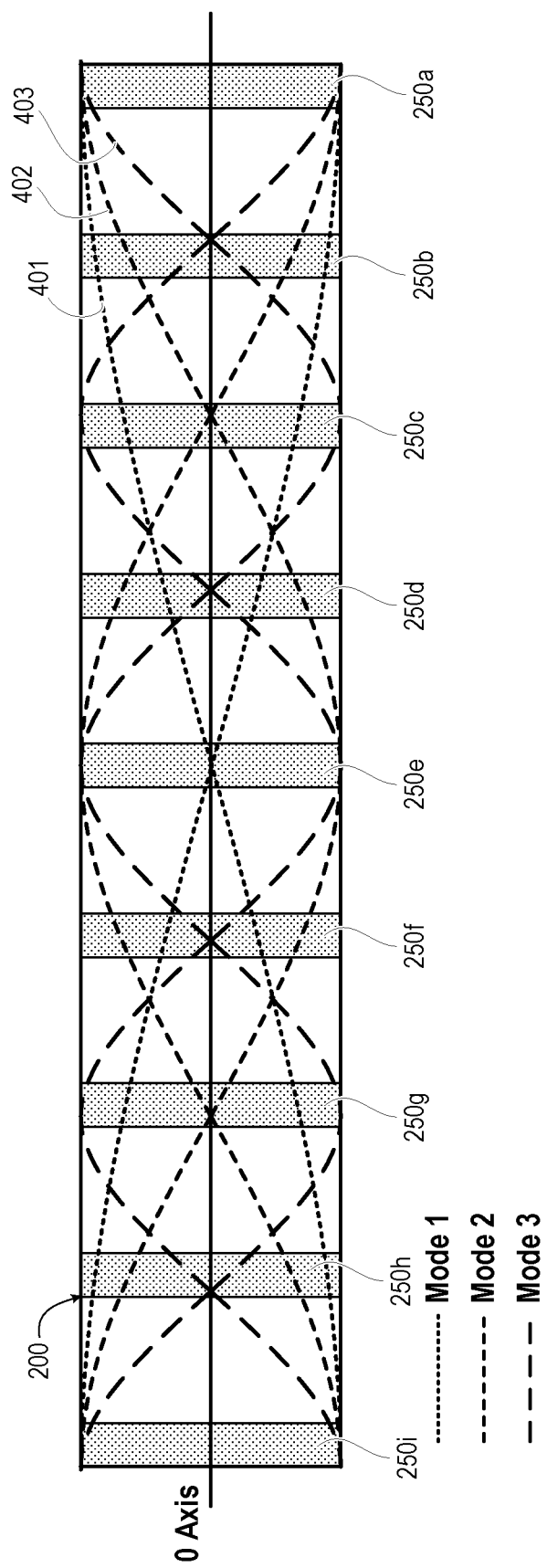
FIG. 4 is a rear view of the air duct of the example IHS that is annotated with three modes of a transverse resonant frequency, according to one or more embodiments.

FIG. 3 is a top view of the example IHS 200. FIG. 4 is a rear view of the example IHS 200. Together, FIGS. 3-4 illustrate that rectangular vertical blocks 250a-h are longitudinally sized to contact both of first and second baffles 214a-b and a top surface of air duct 212, separating air flow 210 into more than one vertically alternating air flows 252a-g (FIG. 3). Air flows 252a-g are longitudinally parallel and pass around first and second baffles 214a-b. First and second baffles 214a-b are longitudinally spaced a distance "L" (FIG. 1) to attenuate a predominant acoustic frequency of one or more air movers 208 without effecting significant constraint on/to the overall air flow 210.

For clarity, FIGS. 2-4 illustrate IHS 200 having nine (9) individual rectangular vertical blocks 250a-h that are positioned at pressure antinodes for three modes of the resonant frequency. The three modes are sinusoids 401-403 (FIG. 4).

A node is a place where pressure fluctuation is 0, or where the sinusoids 401-403 (FIG. 4) cross. An antinode is a place of maximum fluctuation, where the slope of a line of sinusoids 401-403 (FIG. 4) crosses 0. Velocity antinodes can also be targeted with rectangular vertical blocks 250a-h. Fewer or more vertical blocks 250a-h can be used. In one or more embodiments, the rectangular vertical blocks 250a-h are wholly separate and individually attached. In one or more embodiments, rectangular vertical blocks 250a-h are substantially free standing from each other but include a connecting, unitary structure. The unitary structure provides a mounting structure to simplify installation and positioning. The unitary structure can include more than one segmented foam extension to create a similar effect to wholly separate blocks. The unitary structure can be a composite or multipart assembly of metal, foam, and/or plastic. The unitary structure is installed within a server chassis between a fan face and an HDD backplane or cabled HDD connections. Although perhaps also having benefits for reduced noise outside of chassis 204, the present innovation reduces acoustics within chassis 204 to ensure performance and reliability of heat-generating functional component(s) 206 (FIG. 2). In addition to segmented acoustic foam vertical blocks 250a-h, reflective surfaces inside the air duct 212 and baffles 214a-b can be lined at least in part with one or more strips of acoustical absorptive material and separated by a distance chosen to maximize acoustical frequency rejection and minimize airflow impact.

Figure 5:
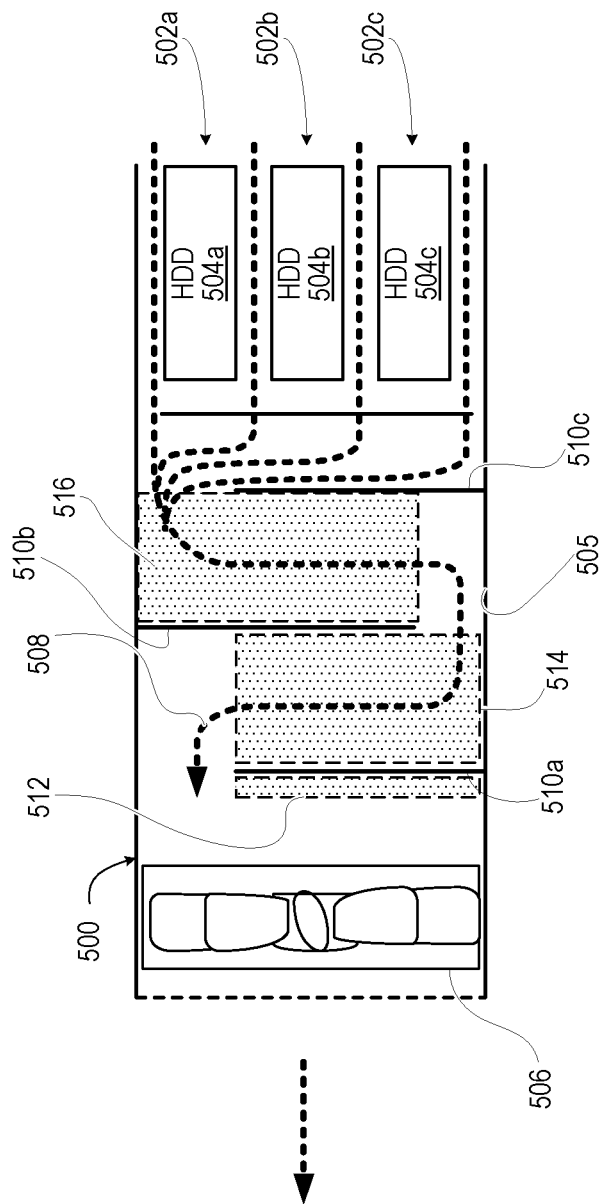
FIG. 5 is a cross-section side view illustrating an example IHS having a three-baffle air duct, according to one or more embodiments.

FIG. 5 is a side view diagram of an IHS 00 having a three-baffle air duct. IHS 500 has stacked HDD drive slots 502a-c that provide air cooling paths for HDDs 504a-c. Fan module(s) 506 draw air flow 508 around HDDs 504a-c and through air duct 505. First, second, and third baffles 510a-c are positioned in parallel with alternating vertical offsets and spaced for acoustic noise rejection of longitudinal noise components. To increase rejection of acoustic noise and vibration, first baffle 510a that is closest to the fan module(s) 506 is covered with transverse panel 512 of acoustic absorbing material. Vertical blocks 514 of an acoustic absorbing material are attached between first and second baffles 510a-b at a respective transverse position of one or more antinodes of a selected one or more of standing waves that can occur between the first and second baffles 510b-c. Vertical blocks 516 of an acoustic absorbing material are attached between second and third baffles 510b-c at a respective transverse position of one or more antinodes of a selected one or more standing waves that can occur between the second and third baffles 510b-c.

Figure 6:
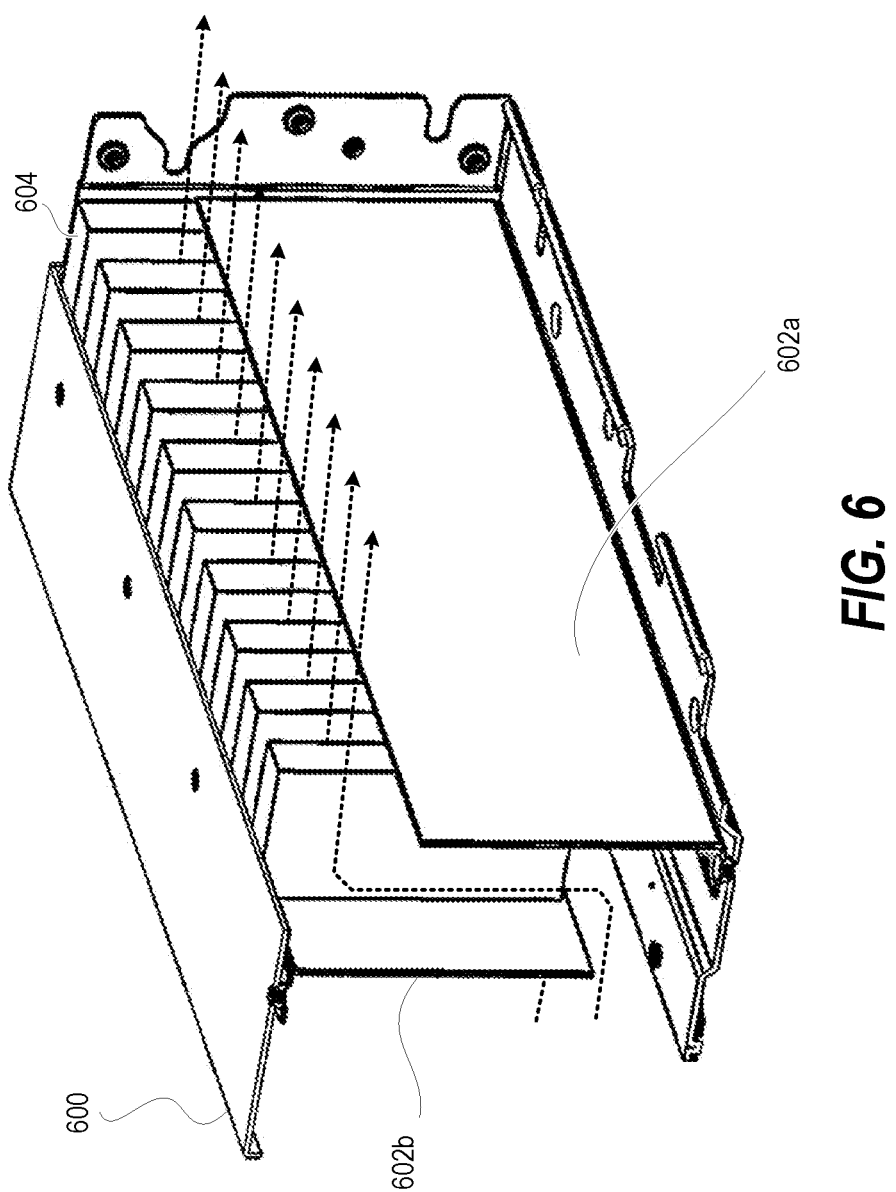
FIG. 6 is an isometric, partially cutaway view of an example air duct with segmented foam acoustic features, according to one or more embodiments.

FIG. 6 is an isometric view of example air duct 600 having first and second baffles 602a-b. Foam block 604 is attached between baffles 602a-b to create small ducts and placed to absorb resonant frequencies that are set up in a horizontal direction in front of the fans and backplane (not shown). Spacings and cutouts are designed for cable passthrough. Baffles 602a-b may be a part of a chassis insert module designed to be included as an add-on to the chassis 204 (FIG. 2). Segmented foam baffle design could be a standalone insert that fits in a one-piece or two-piece chassis design. Segmented foam baffle design may include quick-attach modular points for accepting different solutions or baffle segment designs based on configuration of an IHS. For example, different versions can be customized for different dimensional constraints, HDD models and/or sensitivity to support, and/or air mover types and speeds per thermal cooling needs. The segmented foam baffle solution can be installed selectively where the combination of fans and sensitive HDDs occur. In other embodiments, the segmented foam baffle solution can be readily omitted where not necessary for less sensitive functional components provisioned in chassis 204 (FIG. 2).

Segmented foam solution provided by example air duct 600 is shown to absorb much more acoustic energy than merely placing foam along a top of an air duct while maintaining HDD processing throughput. A measured 5-7% reduction in air flow was determined during prototype testing. When air mover speeds are increased to compensate for the airflow loss and thus increase air mover noise, the noise mitigation provided according to the present disclosure still was significantly larger, equivalent to a net ~10% fan speed decrease. However, the amount of noise mitigation provided according to the present disclosure enables a compensating increase in the fan speed without significant increase in fan speed noise. Air cooling systems having aeroacoustic noise that resonates within a range of 2500 Hz-20 kHz benefit from the segmented foam solution. The segmented foam solution benefits all HDD drive slots from top to bottom.

Figure 7:
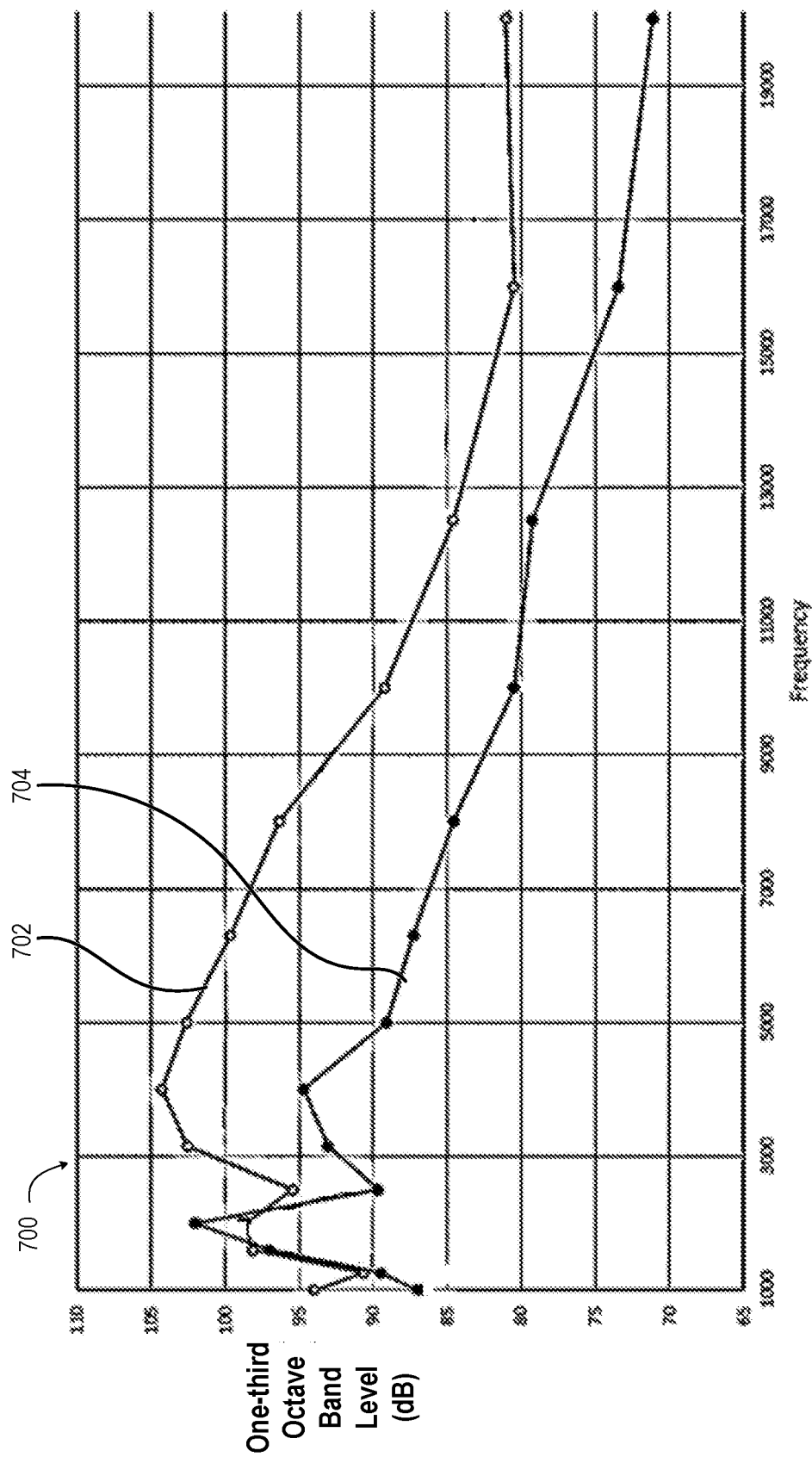
FIG. 7 is graphical plot of aeroacoustic benefit of segmented foam blocks, according to one or more embodiments.

FIG. 7 is a graphical plot 700 comparing an acoustic plot 702 for a conventional and typical configuration to an acoustic plot 704 for a configuration with segmented foam baffles. The comparison indicates an aeroacoustic benefit at a top surface of an HDD of a 10 dB reduction in acoustic level for frequencies from 2500 Hz to 20 kHz. Pronounced improvement in aeroacoustics is evident for latest two rack unit (2U) concept designs with the benefit of an equivalent fan speed reduction being 5-7%. HDD throughput is expected to be more than 90% at 100% fan speed with the benefit of the present disclosure. Vibration carried through chassis 204 (FIG. 2) is reduced across a spectrum of interest.

Figure 8:
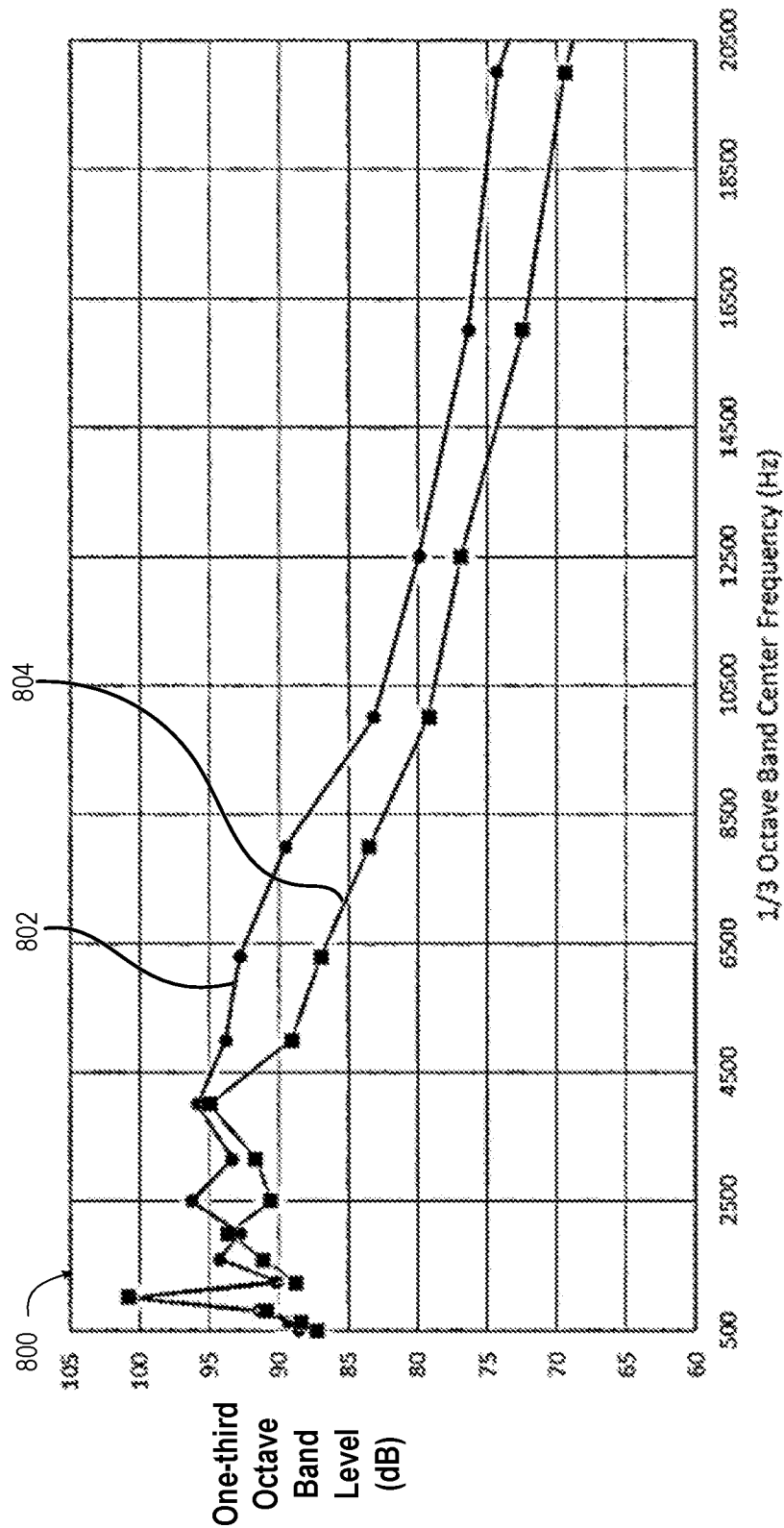
FIG. 8 is graphical plot of acoustic performance of segmented foam blocks at equivalent airflows, according to one or more embodiments.

FIG. 8 is a graphical plot 800 of acoustic performance at equivalent airflow comparing an acoustic plot 802 for a conventional and typical configuration to an acoustic plot 804 for a configuration with segmented foam baffles. Aeroacoustic HDD response for a typical fan operating at 100% in the segmented foam baffle configuration is compared with typical configuration wherein the fan is slowed to achieve the same airflow as the segmented foam solution at 100% fan speed.

Figure 9:
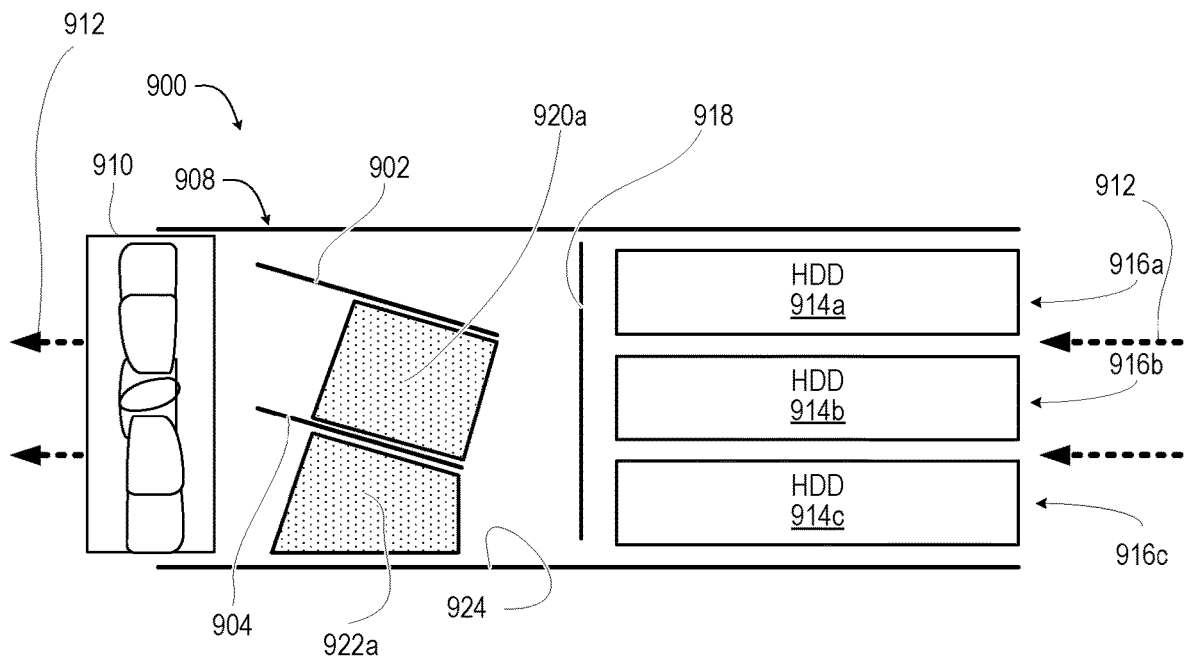
FIG. 9 is a cross-section side view illustrating an example IHS having two louver baffles attached across an air duct and supporting segmented foam blocks for noise attenuation, according to one or more embodiments.
Figure 10:
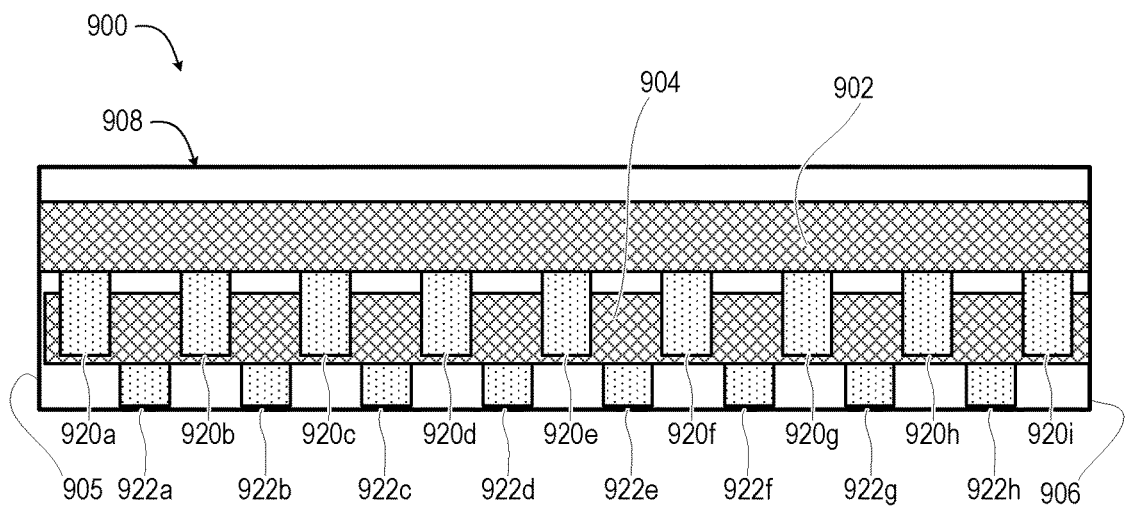
FIG. 10 is rear view of the two louver baffles supporting segmented foam block in the air duct, according to one or more embodiments.

FIGS. 9-10 illustrating an example IHS 900 having upper and lower louver baffles 902, 904 attached across lateral sides 905, 906 (FIG. 10) of air duct 908 in a vertically stacked orientation. Each upper and lower louver baffle 902, 904 are axially rotated to a common angle. The common angle is not vertical. The common angle is not horizontal. The common angle is selected to be an angle between horizontal and vertical. FIG. 9 illustrates fan module 910 drawing cooling air 912 through heat-generating functional components such as HDDs 914a-c. HDDs 914a-c are positioned respectively in vertically spaced slots 916a-c. Cooling air 912 crosses backplane 918 and into horizontal spaces above, between, and below upper and lower louver baffles 902, 904. FIG. 10 illustrates a set of middle segmented foam blocks 920a-i attached between upper and lower louver baffles 902, 904. A set of bottom segmented foam blocks 922a-h is attached between lower louver baffle 902 and bottom surface 924 of air duct 908. Upper and lower louver baffle 902, 904, effectively divide airflow into horizontal streamlines. Middle segmented foam blocks 920a-i are attached at velocity or pressure antinodes between upper and lower louver baffles 902, 904. Bottom segmented foam blocks 922a-h are attached at velocity or pressure antinodes that occur between lower louver baffle 902 and bottom surface 924. Design angle of upper and lower louver baffles 902, 904 are set based on considerations such as space optimization and separation as well as a portion of cross-sectional area blocked for line-of-site acoustic transmission through air duct 908. Design dimensions and angle can be set based on acoustical frequencies to be targeted for attenuation, as well maintaining a significant amount of equivalent airflow. For clarity, two louver baffles 902, 904 are included. However, aspects of the present disclosure extend to implementations with a single louver baffle and/or implementations with three or more louver baffles.

Figure 11:
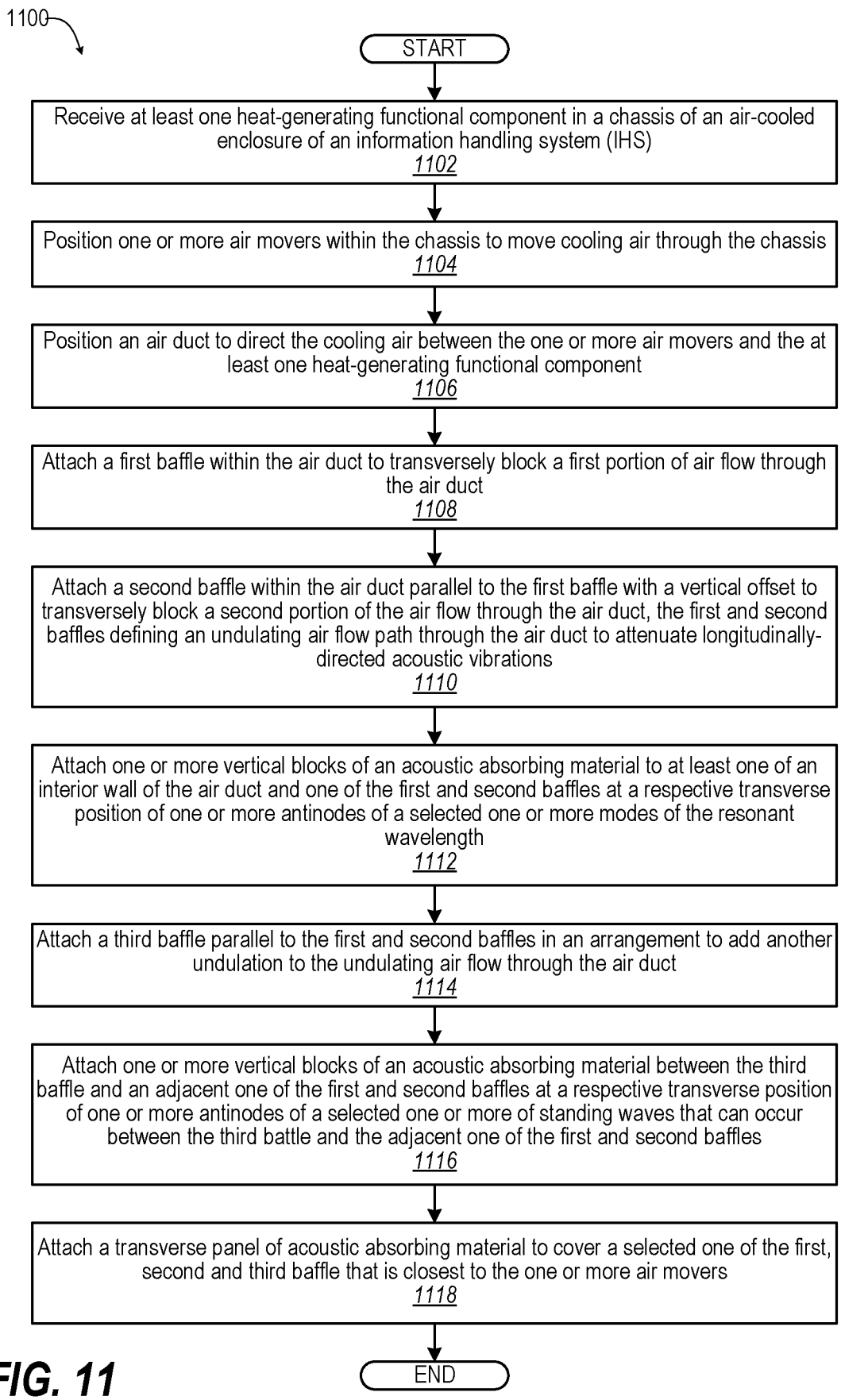
FIG. 11 is a flow diagram of a method of making an IHS having an air-cooled enclosure with an internal acoustic attenuating air duct, according to one or more embodiments.

FIG. 11 is a flow diagram illustrating a method 1100 for assembling an IHS that internally attenuates acoustic energy caused by an air mover such as a fan module within an air duct. In the presented embodiment, method 1100 begins with an automated manufacturing system receiving at least one heat-generating functional component in a chassis of an air-cooled enclosure of an IHS (block 1102). Method 1100 includes positioning one or more air movers within the chassis to move cooling air through the chassis (block 1104). Method 1100 includes positioning an air duct to direct the cooling air between the one or more air movers and the at least one heat-generating functional component (block 1106). The air duct has a transverse dimension defining a resonant wavelength. Method 1100 includes attaching a first baffle within the air duct to transversely block a first portion of air flow through the air duct (block 1108). Method 1100 includes attaching a second baffle within the air duct parallel to the first baffle with a vertical offset to transversely block a second portion of the air flow through the air duct (block 1110). The first and second baffles defining a vertically alternating air flow path through the air duct to attenuate longitudinally-directed acoustic vibrations. A transverse space across the air duct between the first and second baffles is sized for one or more acoustic standing waves to resonate between lateral walls of the air duct as modes of the resonant wavelength. In one or more embodiments, method 1100 includes longitudinally spacing the first and second baffles to attenuate a predominant acoustic frequency of the one or more air movers without significant constraint to the vertically alternating air flow. In one or more embodiments, method 1100 includes attaching one or more vertical blocks of an acoustic absorbing material to at least one of an interior wall of the air duct and one of the first and second baffles at a respective transverse position of one or more antinodes of a selected one or more modes of the resonant wavelength (block 1112). In one or more embodiments, method 1100 includes longitudinally sizing the one or more vertical blocks to contact both of the first and second baffles and one of a top and a bottom of the air duct. The one or more vertical blocks separate the vertically alternating air flow into more than one longitudinally parallel vertically alternating air flows that pass around the first and second baffles.

In one or more embodiments, method 1100 includes attaching a third baffle parallel to the first and second baffles in an arrangement of alternating vertical offsets to add another undulation or repetition to the vertically alternating air flow through the air duct (block 1114). Method 1100 includes attaching one or more vertical blocks of an acoustic absorbing material between the third baffle and an adjacent one of the first and second baffles at a respective transverse position of one or more antinodes of a selected one or more of standing waves that can occur between the third baffle and the adjacent one of the first and second baffles (block 1116). In one or more embodiments, method 1100 includes attaching a transverse panel of acoustic absorbing material to cover a selected one of the first, second and third baffles that is closest to the one or more air movers (block 1118). Then method 1100 ends.

In the above described flow chart of FIG. 11 one or more of the method processes may be embodied in an automated manufacturing controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An air-cooled enclosure comprising:
    a chassis that receives at least one heat-generating functional component of an information handling system;
    one or more air movers positioned within the chassis to move cooling air through the chassis;
    an air duct provided within the chassis and positioned to direct the cooling air between the one or more air movers and the at least one heat-generating functional component, the air duct having a transverse space across the air duct sized for one or more acoustic standing waves to resonate between lateral walls of the air duct as modes of a resonant wavelength;
    one or more vertical blocks of an acoustic absorbing material, each one of the vertical blocks attached inside the air duct at a respective transverse position of one or more antinodes of a selected one or more modes of the resonant wavelength;
    a first baffle attached within the air duct to transversely block a first portion of air flow through the air duct; and
    a second baffle attached within the air duct parallel to the first baffle with a vertical offset to transversely block a second portion of the air flow through the air duct, the first and second baffles defining a vertically alternating air flow path through the air duct to attenuate longitudinally-directed acoustic vibrations.

2. The air-cooled enclosure of claim 1, wherein the one or more vertical blocks are longitudinally sized to contact both of the first and second baffles and one of a top and a bottom of the air duct, separating the vertically alternating air flow into more than one longitudinally parallel vertically alternating air flows that pass around the first and second baffles.

3. The air-cooled enclosure of claim 1, further comprising a transverse panel of acoustic absorbing material attached to and covering a selected one of the first and second baffle that is closest to the one or more air movers.

4. The air-cooled enclosure of claim 1, further comprising:
    a third baffle that is parallel to the first and second baffles and arranged with alternating vertical offsets to add another undulation to the vertically alternating air flow through the air duct; and
    one or more vertical blocks of an acoustic absorbing material, each one of the vertical blocks attached between the third baffle and an adjacent one of the first and second baffles at a respective transverse position of one or more antinodes of a selected one or more of standing waves that can occur between the third battle and the adjacent one of the first and second baffles.

5. The air-cooled enclosure of claim 1, wherein:
    the first and second baffles are longitudinally spaced to attenuate a predominant acoustic frequency of the one or more air movers; and
    each one of the vertical blocks are attached inside the air duct at the respective transverse position of a selected one of: (i) a pressure antinode; and (ii) a velocity antinode of the selected one or more modes of the resonant wavelength.

6. The air-cooled enclosure of claim 1, wherein the first and second baffles are vertically oriented with one of the first and second baffles attached to a top inner surface of the air duct and another of the first and second baffles attached to a bottom inner surface of the air duct.

7. The air-cooled enclosure of claim 1, wherein the first and second baffles respectively comprise first and second louvered blades attached across lateral sides of the air duct in a vertically stacked orientation and each axially rotated to a common angle between horizontal and vertical.

8. An information handling system (IHS) comprising:
    at least one heat-generating functional component; and
    an air-cooled enclosure comprising:
        a chassis that receives the at least one heat-generating functional component;

one or more air movers positioned within the chassis to move cooling air through the chassis;

an air duct provided within the chassis and positioned to direct the cooling air between the one or more air movers and the at least one heat-generating functional component, the air duct having a transverse space across the air duct sized for one or more acoustic standing waves to resonate between lateral walls of the air duct as modes of a resonant wavelength;

one or more vertical blocks of an acoustic absorbing material, each one of the vertical blocks attached inside the air duct at a respective transverse position of one or more antinodes of a selected one or more modes of the resonant wavelength;

a first baffle attached within the air duct to transversely block a first portion of air flow through the air duct; and a second baffle attached within the air duct parallel to the first baffle with a vertical offset to transversely block a second portion of the air flow through the air duct, the first and second baffles defining a square wave air flow path through the air duct to attenuate longitudinally-directed acoustic vibrations.

9. The IHS of claim 8, wherein the one or more vertical blocks are longitudinally sized to contact both of the first and second baffles and one of a top and a bottom of the air duct, separating the square wave air flow into more than one longitudinally parallel square wave air flows that pass around the first and second baffles.

10. The IHS of claim 8, further comprising a transverse panel of acoustic absorbing material attached to and covering a selected one of the first and second baffle that is closest to the one or more air movers.

11. The IHS of claim 8, further comprising:

a third baffle that is parallel to the first and second baffles and arranged with alternating vertical offsets to add another undulation to the square wave air flow through the air duct; and one or more vertical blocks of an acoustic absorbing material, each one of the vertical blocks attached between the third baffle and an adjacent one of the first and second baffles at a respective transverse position of one or more antinodes of a selected one or more of standing waves that can occur between the third battle and the adjacent one of the first and second baffles.

12. The IHS of claim 8, wherein the first and second baffles are longitudinally spaced to attenuate a predominant acoustic frequency of the one or more air movers.

13. A method comprising:

receiving at least one heat-generating functional component in a chassis of an air-cooled enclosure of an information handling system (IHS);

positioning one or more air movers within the chassis to move cooling air through the chassis;

positioning an air duct to direct the cooling air between the one or more air movers and the at least one heat-generating functional component, the air duct having a transverse space across the air duct sized for one or more acoustic standing waves to resonate between lateral walls of the air duct as modes of a resonant wavelength;

attaching one or more vertical blocks of an acoustic absorbing material inside the air duct at a respective transverse position of one or more antinodes of a selected one or more modes of the resonant wavelength;

attaching a first baffle within the air duct to transversely block a first portion of air flow through the air duct; and attaching a second baffle within the air duct parallel to the first baffle with a vertical offset to transversely block a second portion of the air flow through the air duct, the first and second baffles defining a square wave air flow path through the air duct to attenuate longitudinally-directed acoustic vibrations.

14. The method of claim 13, further comprising sizing the one or more vertical blocks to contact both of the first and second baffles and one of a top and a bottom of the air duct to separate the square wave air flow into more than one longitudinally parallel square wave air flows that pass around the first and second baffles.

15. The method of claim 13, further comprising attaching a transverse panel of acoustic absorbing material to cover a selected one of the first and second baffle that is closest to the one or more air movers.

16. The method of claim 13, further comprising:

attaching a third baffle parallel to the first and second baffles in an arrangement of alternating vertical offsets to add another undulation to the square wave air flow through the air duct; and attaching one or more vertical blocks of an acoustic absorbing material between the third baffle and an adjacent one of the first and second baffles at a respective transverse position of one or more antinodes of a selected one or more of standing waves that can occur between the third battle and the adjacent one of the first and second baffles.

17. The method of claim 13, further comprising longitudinally spacing the first and second baffles to attenuate a predominant acoustic frequency of the one or more air movers.

* * * * *